United States Patent
Wu et al.

(10) Patent No.: US 12,261,195 B2
(45) Date of Patent: Mar. 25, 2025

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Yulei Wu, Hefei (CN); Bin Yang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 624 days.

(21) Appl. No.: 17/457,809

(22) Filed: Dec. 6, 2021

(65) Prior Publication Data
US 2023/0006030 A1 Jan. 5, 2023

Related U.S. Application Data

(63) Continuation of application No. PCT/CN2021/112198, filed on Aug. 12, 2021.

(30) Foreign Application Priority Data

Jul. 2, 2021 (CN) .......................... 202110753746.X

(51) Int. Cl.
*H10B 12/00* (2023.01)
*H01L 49/02* (2006.01)

(52) U.S. Cl.
CPC ............ *H01L 28/60* (2013.01); *H10B 12/03* (2023.02); *H10B 12/30* (2023.02)

(58) Field of Classification Search
CPC .................................. H10B 12/03; H10B 12/30
See application file for complete search history.

(56) References Cited

U.S. PATENT DOCUMENTS

| | | | |
|---|---|---|---|
| 9,330,960 | B2 | 5/2016 | Cho et al. |
| 9,349,736 | B2 | 5/2016 | Hung et al. |

(Continued)

FOREIGN PATENT DOCUMENTS

| | | |
|---|---|---|
| CN | 107968044 A | 4/2018 |
| CN | 108155152 A | 6/2018 |

(Continued)

OTHER PUBLICATIONS

International Search Report cited in PCT/CN2021/112198, mailed Mar. 28, 2022, 8 pages.

*Primary Examiner* — Moazzam Hossain
*Assistant Examiner* — Hajar Kolahdouzan
(74) *Attorney, Agent, or Firm* — Kilpatrick Townsend & Stockton LLP

(57) ABSTRACT

The present disclosure provides a manufacturing method of a semiconductor structure, and a semiconductor structure. The manufacturing method of a semiconductor structure includes: forming a plurality of cylindrical capacitors in an initial structure; removing part of the initial structure to form trenches, the trenches expose partial sidewalls of the cylindrical capacitors and a substrate of the initial structure; forming a dielectric layer, the dielectric layer at least covers an exposed surface of each of the cylindrical capacitors; forming a first top electrode, the first top electrode covers a surface of the dielectric layer; and forming a second top electrode, the second top electrode covers a surface of the first top electrode. In an axial direction of each of the cylindrical capacitors, the second top electrode formed in each of the trenches has a discontinuous part, and an air gap is formed in the discontinuous part of the second top electrode.

13 Claims, 12 Drawing Sheets

(56) References Cited

U.S. PATENT DOCUMENTS

| | | | |
|---|---|---|---|
| 2004/0259308 A1* | 12/2004 | Chung | H01L 28/75 |
| | | | 438/396 |
| 2005/0051822 A1 | 3/2005 | Manning | |
| 2015/0171088 A1* | 6/2015 | Hung | H10B 12/315 |
| | | | 438/397 |
| 2020/0144269 A1* | 5/2020 | Kim | H01L 28/90 |
| 2020/0176552 A1* | 6/2020 | Chang | H01L 23/5329 |

FOREIGN PATENT DOCUMENTS

| | | |
|---|---|---|
| CN | 110504283 A | 11/2019 |
| CN | 110504284 A | 11/2019 |

* cited by examiner

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2021/112198, filed on Aug. 12, 2021 and titled "SEMICONDUCTOR STRUCTURE AND MANUFACTURING METHOD THEREOF", which claims the priority to Chinese Patent Application 202110753746.X, filed on Jul. 2, 2021 and titled "SEMICONDUCTOR STRUCTURE AND MANUFACTURING METHOD THEREOF". The entire contents of International Patent Application No. PCT/CN2021/112198 and Chinese Patent Application 202110753746.X are incorporated herein by reference.

TECHNICAL FIELD

The present disclosure relates to, but is not limited to, a semiconductor structure and a manufacturing method thereof.

BACKGROUND

A dynamic random access memory (DRAM) has the advantages of small size, high integration and low power consumption, and the data reading speed of the DRAM is faster than that of a read-only memory (ROM). As the integration of the DRAM increases, the feature size and plate area of the capacitor continue to decrease, and a thinner dielectric material with a higher dielectric constant needs to be selected to increase the capacitor density during manufacturing of the DRAM. Moreover, while ensuring a high enough capacitance value that meets the requirement, it is further necessary to ensure that the leakage current of the capacitor is low enough.

SUMMARY

According to a first aspect, the present disclosure provides a manufacturing method of a semiconductor structure. The manufacturing method includes:

forming a plurality of cylindrical capacitors in an initial structure;

removing part of the initial structure to form trenches, where the trenches expose partial sidewalls of the cylindrical capacitors and a substrate of the initial structure;

forming a dielectric layer, where the dielectric layer at least covers an exposed surface of each of the cylindrical capacitors;

forming a first top electrode, where the first top electrode covers a surface of the dielectric layer; and forming a second top electrode, where the second top electrode covers a surface of the first top electrode.

According to a second aspect, the present disclosure provides a semiconductor structure, including:

a substrate;

capacitor contact structures, located in the substrate;

cylindrical capacitors, where a bottom of each of the cylindrical capacitors is electrically connected to one of the capacitor contact structures;

trenches, where each of the trenches is located between adjacent cylindrical capacitors;

a dielectric layer, covering a surface of each of the cylindrical capacitors and part of the substrate;

a first top electrode, covering a surface of the dielectric layer; and a second top electrode, covering the first top electrode, where the second top electrode includes discontinuous parts, each of the discontinuous parts is located in the trench, and an air gap is provided in the discontinuous part.

BRIEF DESCRIPTION OF THE DRAWINGS

The drawings incorporated into the specification and constituting a part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

FIG. 14 is a cross sectional view taken along A-A in FIG. 13;

DETAILED DESCRIPTION

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that without conflict, the embodiments in the present disclosure and features in the embodiments may be combined with each other randomly.

Currently, the capacitor is manufactured by forming a top electrode on a dielectric material after forming the dielectric material, and then forming a boron-doped layer on the top electrode to increase the conductivity of the capacitor. Due to the small radius of boron particles, the thermal process intensifies the penetration of boron particles into the dielectric material, which easily leads to capacitor leakage.

In view of this, the present disclosure provides a manufacturing method of a semiconductor structure. An air gap is formed between adjacent cylindrical capacitors, to reduce the boron-doped layer filled between the cylindrical capacitors, and also reduce the density of boron particles in the boron-doped layer. The total amount of boron particles diffused into the dielectric material during the thermal process is significantly reduced, such that the semiconductor structure leakage can be avoided.

Figure 1:
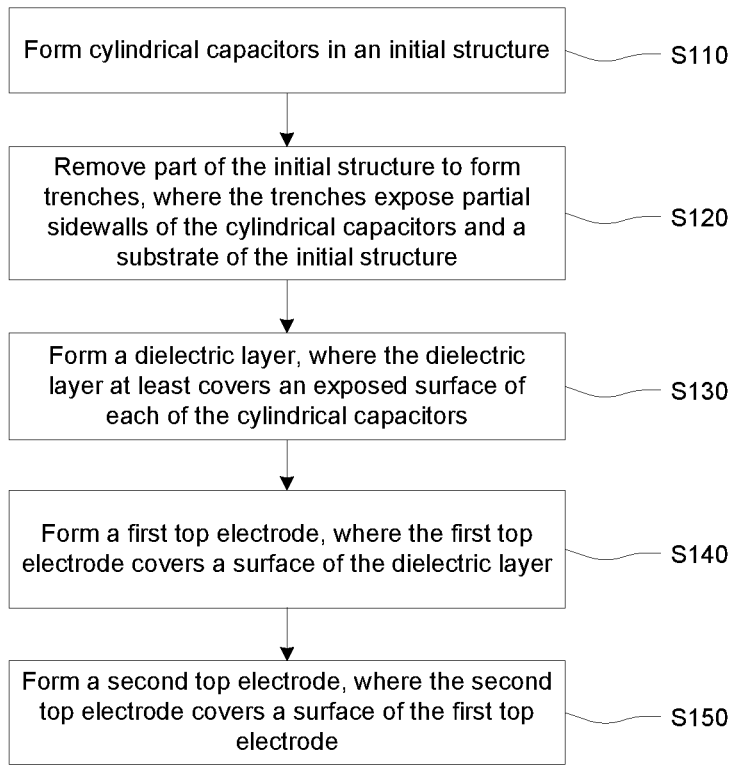
FIG. 1 is a flowchart of a manufacturing method of a semiconductor structure according to an exemplary embodiment.

An exemplary embodiment of the present disclosure provides a manufacturing method of a semiconductor structure. FIG. 1 shows a flowchart of a manufacturing method of a semiconductor structure according to an exemplary embodiment of the present disclosure. FIG. 7 to FIG. 22 are schematic diagrams of various stages of the manufacturing method of a semiconductor structure. The manufacturing method of a semiconductor structure is described below with reference to FIG. 7 to FIG. 22.

The semiconductor structure is not limited in this embodiment. The semiconductor structure is described below by taking a dynamic random access memory (DRAM) as an example, but this embodiment is not limited to this, and the semiconductor structure in this embodiment may also be other structure.

As shown in FIG. 1, an exemplary embodiment of the present disclosure provides a manufacturing method of a semiconductor structure. The manufacturing method includes the following steps:

S110: Form cylindrical capacitors in an initial structure.

Figure 7:
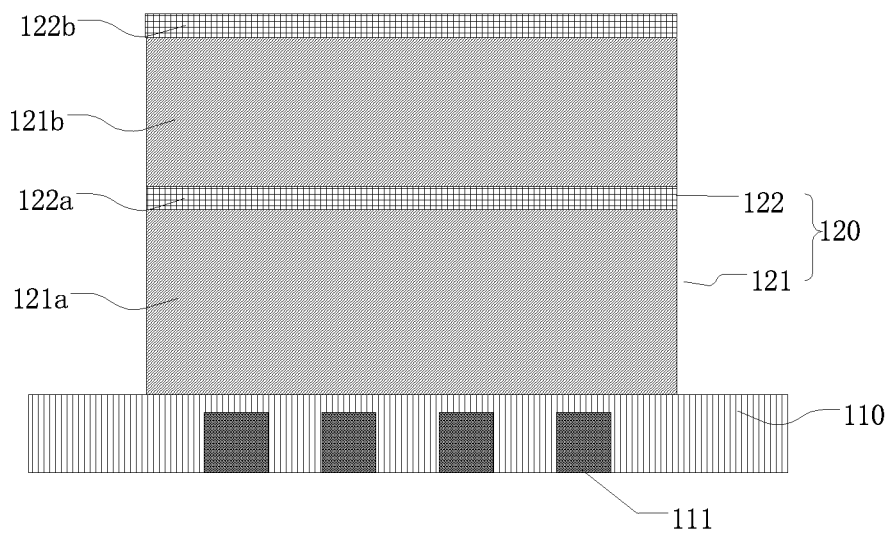
FIG. 7 is a schematic diagram of an initial structure in a manufacturing method of a semiconductor structure according to an exemplary embodiment.
Figure 11:
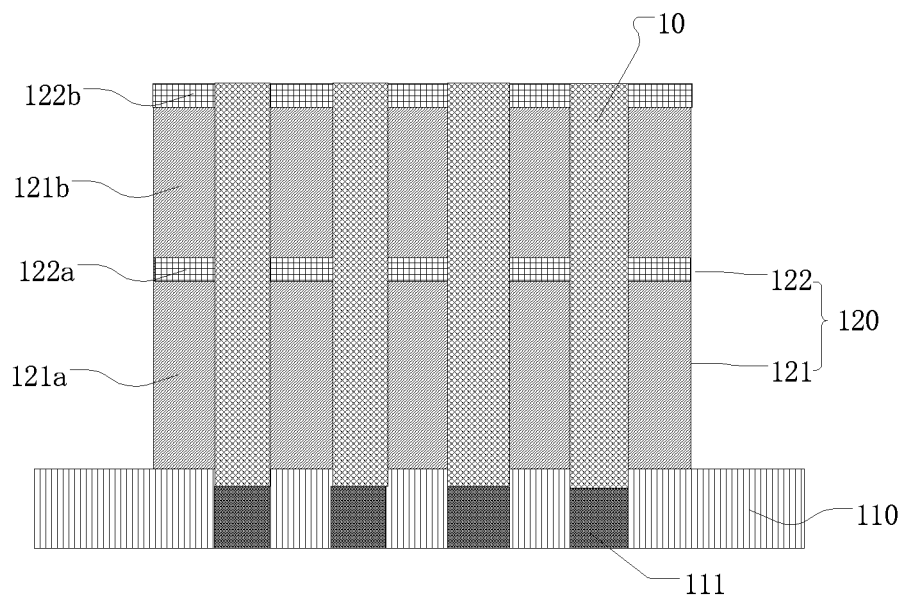
FIG. 11 is a schematic diagram of forming cylindrical capacitors in a manufacturing method of a semiconductor structure according to an exemplary embodiment.

As shown in FIG. 7, the initial structure 100 includes a substrate 110 and a stacked structure 120 provided on the substrate 110, and capacitor contact structures 111 are provided in the substrate. Referring to FIG. 11, the cylindrical capacitors 10 are formed in the stacked structure 120. The cylindrical capacitors 10 are connected to the capacitor contact structures 111 respectively, and top surfaces of the cylindrical capacitors 10 are flush with a top surface of the stacked structure 120. Multiple capacitor contact structures 111 are distributed in the substrate 110, and multiple cylindrical capacitors 10 can be formed in the stacked structure 120. The multiple cylindrical capacitors 10 are connected to the multiple capacitor contact structures 111 respectively.

The substrate 110 is a semiconductor substrate, and includes a silicon-containing substance. The substrate 110 may include a silicon substrate, a silicon-germanium substrate or a silicon on insulator (SOI) substrate.

The cylindrical capacitor 10 can be deposited through atomic layer deposition (ALD). The material of the cylindrical capacitor 10 includes a compound formed from one or both of a metal nitride and a metal silicide, such as titanium nitride, titanium silicide, titanium silicide, $TiSi_xN_y$, etc.

S120: Remove part of the initial structure to form trenches, where the trenches expose partial sidewalls of the cylindrical capacitors and a substrate of the initial structure.

Figure 12:
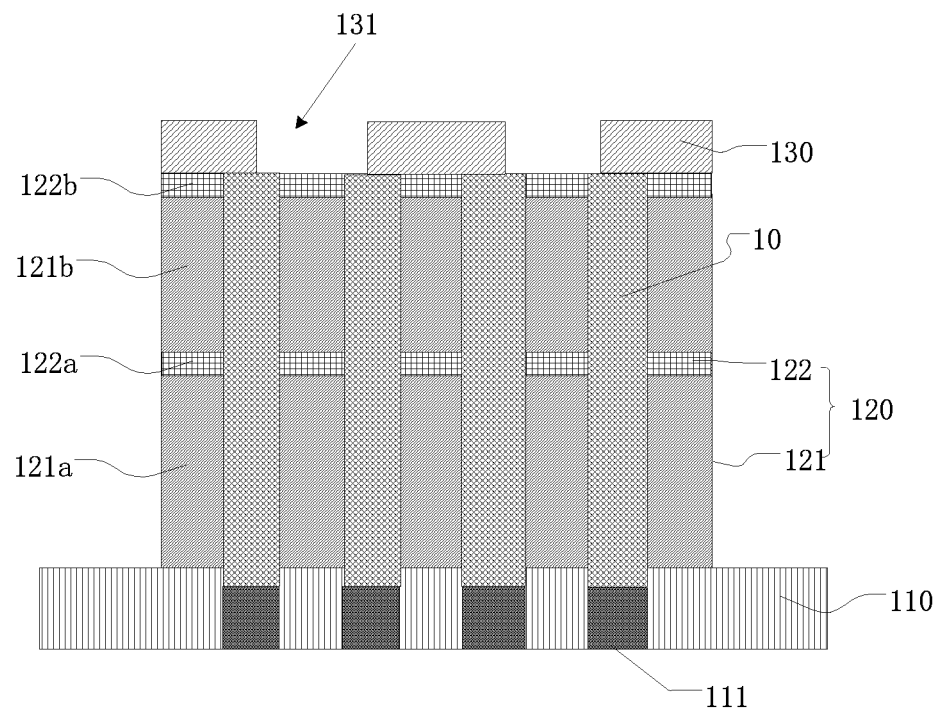
FIG. 12 is a schematic diagram of forming a first mask layer on an initial structure in a manufacturing method of a semiconductor structure according to an exemplary embodiment.
Figure 17:
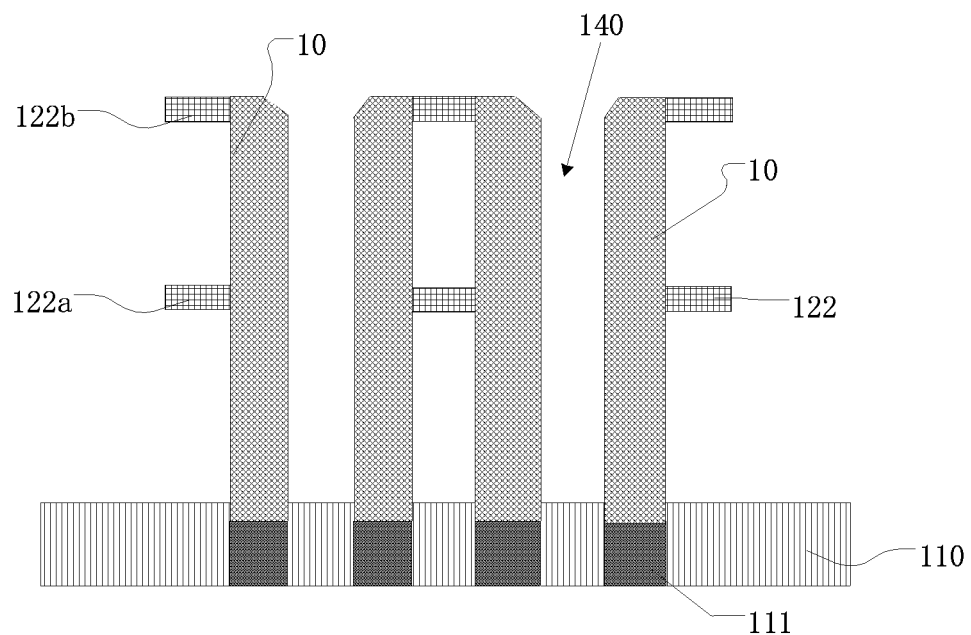
FIG. 17 is a schematic diagram of removing a first sacrificial layer in a manufacturing method of a semiconductor structure according to an exemplary embodiment.

As shown in FIG. 12, a first mask layer 130 is formed on the stacked structure 120; a first pattern 131 is defined on the first mask layer 130, and the first pattern 131 at least exposes partial top surface of each of the cylindrical capacitors 10. A part of or all of the stacked structure 120 is removed through etching according to the first mask layer 130, to expose a surface of the substrate 110, and then etching is stopped, to obtain the trenches 140, as shown in FIG. 17. The trenches 140 at least expose partial sidewalls of the cylindrical capacitors 10 and the surface of the substrate 110.

S130: Form a dielectric layer, where the dielectric layer at least covers an exposed surface of each of the cylindrical capacitors.

Figure 18:
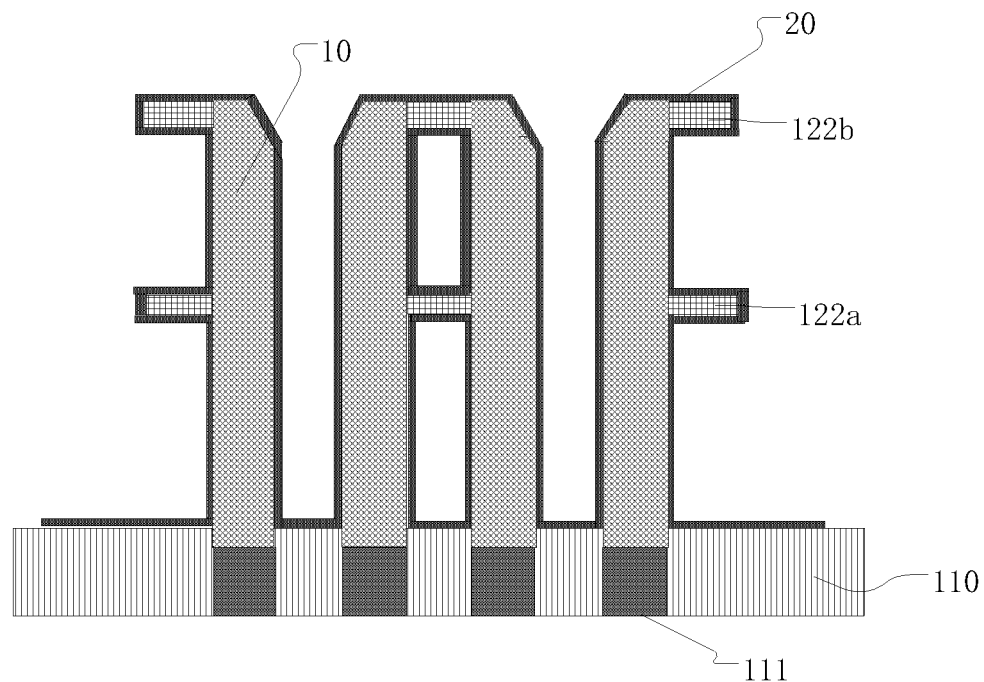
FIG. 18 is a schematic diagram of forming a dielectric layer in a manufacturing method of a semiconductor structure according to an exemplary embodiment.

As shown in FIG. 18, the dielectric layer 20 can be deposited through atomic layer deposition (ALD). The dielectric layer 20 is made of a high-k material, which has a dielectric constant greater than that of silicon dioxide. In this embodiment, the high-k material of the dielectric layer may include a compound containing one or more of the following components: rare earth elements, Hf, Rh, Ba and Al. The high-k material can be hafnium (IV) oxide, titanium nitride, aluminum oxide, lanthanum oxide, etc.

S140: Form a first top electrode, where the first top electrode covers a surface of the dielectric layer.

Figure 19:
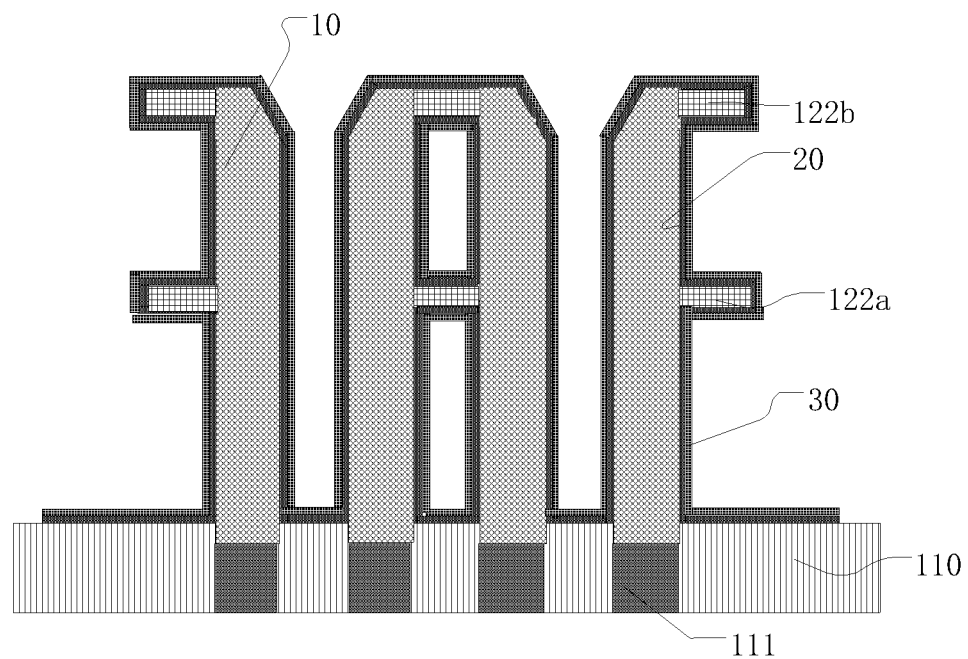
FIG. 19 is a schematic diagram of forming a first top electrode in a manufacturing method of a semiconductor structure according to an exemplary embodiment.

As shown in FIG. 19, the material of the first top electrode 30 includes a compound formed from one or both of a metal nitride and a metal silicide. In this embodiment, the first top electrode 30 may include one or two of titanium nitride, titanium silicide, titanium silicide, and TiSi$_x$N$_y$.

S150: Form a second top electrode, where the second top electrode covers the surface of the first top electrode.

Figure 20:
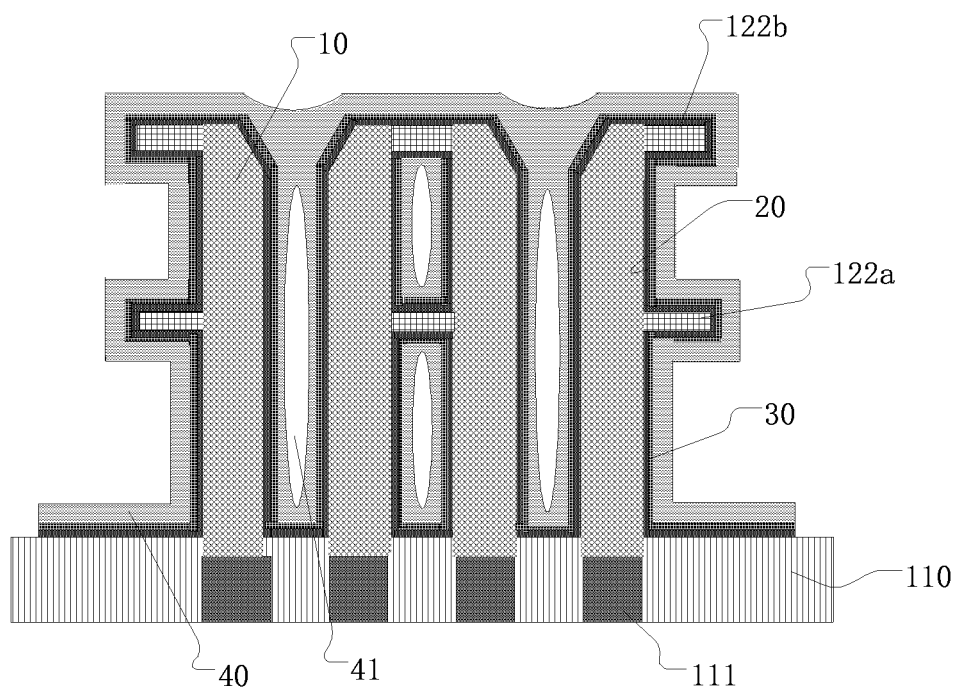
FIG. 20 is a schematic diagram of forming a second top electrode in a manufacturing method of a semiconductor structure according to an exemplary embodiment.

As shown in FIG. 20, in an axial direction of each of the cylindrical capacitors 10, the second top electrode 40 formed in each of the trenches has a discontinuous part, and an air gap 41 is formed in each of the discontinuous parts of the second top electrode 40.

The material of the second top electrode 40 includes a compound formed from one or both of a metal nitride and a metal silicide. In this embodiment, the second top electrode 40 may include one or two of titanium nitride, titanium silicide, titanium silicide, and TiSi$_x$N$_y$.

In this embodiment, each of the discontinuous part of the second top electrode 40 covers the partial sidewall, which is exposed by the trench 140, of the cylindrical capacitor 10, and on the partial sidewall of the cylindrical capacitor 10 covered by the discontinuous part, the thickness of the second top electrode 40 changes continuously.

In the semiconductor structure made by the manufacturing method of this embodiment, as shown in FIG. 20, an air gap 41 is formed in each of the trenches 140 in the axial direction of each of the cylindrical capacitors 10, and the thickness of the second top electrode 40 covering the sidewalls of the cylindrical capacitor 10 changes continuously. That is, the air gap 41 is a closed air gap formed inside the second top electrode 40. The boron-doped layer of the semiconductor structure made in this embodiment cannot fill the space between adjacent cylindrical capacitors 10, thus reducing the total amount of deposited boron particles. The total amount of boron particles diffused into the dielectric material during the thermal process is significantly reduced, thereby avoiding the semiconductor structure leakage.

Figure 2:
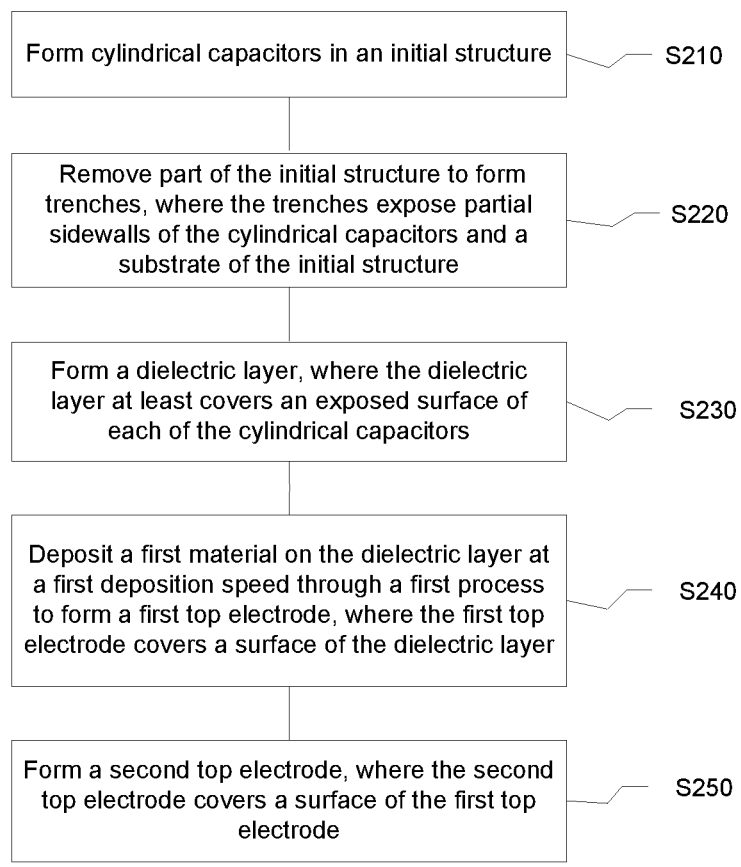
FIG. 2 is a flowchart of a manufacturing method of a semiconductor structure according to an exemplary embodiment.

An exemplary embodiment of the present disclosure provides a manufacturing method of a semiconductor structure. FIG. 2 shows a flowchart of a manufacturing method of a semiconductor structure according to an exemplary embodiment of the present disclosure. FIG. 7 to FIG. 22 are schematic diagrams of various stages of the manufacturing method of a semiconductor structure. The manufacturing method of a semiconductor structure is described below with reference to FIG. 7 to FIG. 22.

The semiconductor structure is not limited in this embodiment. The semiconductor structure is described below by taking a dynamic random access memory (DRAM) as an example, but this embodiment is not limited to this, and the semiconductor structure in this embodiment may also be other structure.

As shown in FIG. 2, an exemplary embodiment of the present disclosure provides a manufacturing method of a semiconductor structure. The manufacturing method includes the following steps:

S210: Form cylindrical capacitors in an initial structure.

S220: Remove part of the initial structure to form trenches, where the trenches expose partial sidewalls of the cylindrical capacitors and a substrate of the initial structure.

S230: Form a dielectric layer, where the dielectric layer at least covers an exposed surface of each of the cylindrical capacitors.

S240: Deposit a first material on the dielectric layer at a first deposition speed through a first process to form a first top electrode, where the first top electrode covers a surface of the dielectric layer.

S250: Form a second top electrode, where the second top electrode covers a surface of the first top electrode.

Steps S210 to S230 and step S250 in this embodiment are implemented in the same manner as steps S110 to S130 and step S150 of the foregoing embodiment, and will not be described in detail again herein.

In step S240 in this embodiment, during formation of the first top electrode, the first material is deposited on the dielectric layer at the first deposition speed through the first process, to form the first top electrode.

In this embodiment, the first process can be atomic layer deposition (ALD). The first material may include a compound formed from one or both of a metal nitride and a metal silicide, such as titanium nitride, titanium silicide, titanium silicide, TiSi$_x$N$_y$, etc. The first deposition speed is less than 5 Å/min.

The atomic layer deposition can precisely control the thickness of the deposited first top electrode, and in this embodiment, the thickness of the first top electrode deposited on the dielectric layer is 8 nm.

In this embodiment, the first top electrode formed through the atomic layer deposition has a uniform thickness and high surface uniformity on the dielectric layer.

Figure 3:
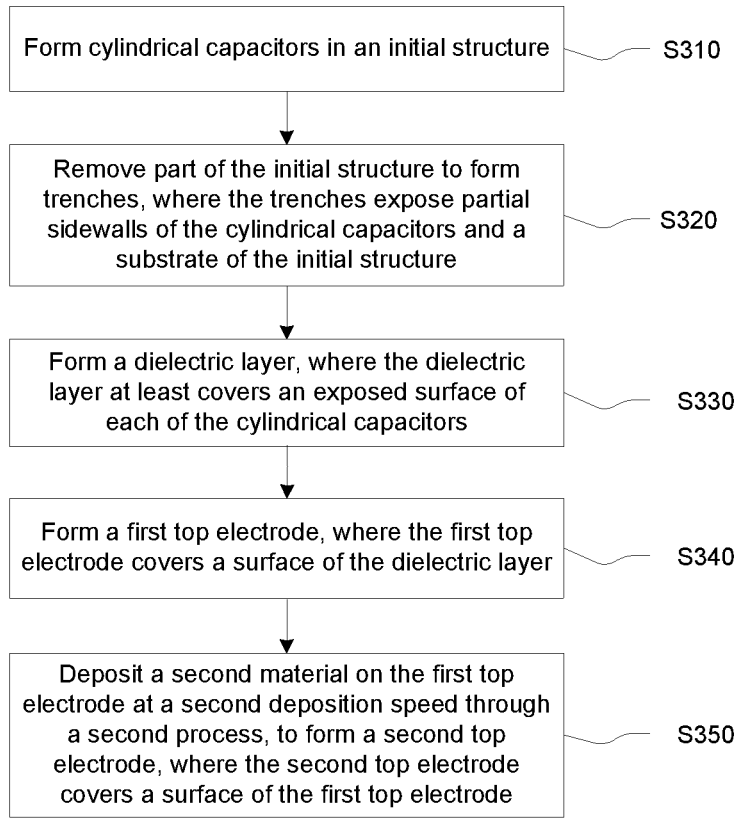
FIG. 3 is a flowchart of a manufacturing method of a semiconductor structure according to an exemplary embodiment.

An embodiment of the present disclosure provides a manufacturing method of a semiconductor structure. FIG. 3 shows a flowchart of a manufacturing method of a semiconductor structure according to an exemplary embodiment of the present disclosure.

The semiconductor structure is not limited in this embodiment. The semiconductor structure is described below by taking a dynamic random access memory (DRAM) as an example, but this embodiment is not limited to this, and the semiconductor structure in this embodiment may also be other structure.

As shown in FIG. 3, an exemplary embodiment of the present disclosure provides a manufacturing method of a semiconductor structure. The manufacturing method includes the following steps:

S310: Form cylindrical capacitors in an initial structure.

S320: Remove part of the initial structure to form trenches, where the trenches expose partial sidewalls of the cylindrical capacitors and a substrate of the initial structure.

S330: Form a dielectric layer, where the dielectric layer at least covers an exposed surface of each of the cylindrical capacitors.

S340: Form a first top electrode, where the first top electrode covers a surface of the dielectric layer.

S350: Deposit a second material on the first top electrode at a second deposition speed through a second process, to form a second top electrode, where the second top electrode covers a surface of the first top electrode.

Steps S310, S330, and S340 in this embodiment are implemented in the same manner as steps S210, S230, and S240 of the foregoing embodiment, and will not be described in detail again herein.

In step S320 in this embodiment, as shown in FIG. 7, the stacked structure 120 includes sacrificial layers 121 and support layers 122, and part of the initial structure 100 is removed to form the trenches 140. In the process of forming the trenches 140, the sacrificial layers 121 and part of the support layers 122 of the initial structure 100 are removed to form the trenches 140. The sacrificial layers 121 and the support layers 122 are formed above the substrate 110, where the sacrificial layers 121 and the support layers 122 are stacked alternately. In this embodiment, the cylindrical capacitors 10 are formed by etching the stacked structure 120. The specific number of laminated layers and the laminated height of the sacrificial layers 121 and the support layers 122 in the stacked structure 120 are set according to the height of the cylindrical capacitors 10 to be formed. As shown in FIG. 7, in a direction of moving away from the substrate, the stacked structure 120 includes a first sacrificial layer 121a, a first support layer 122a, a second sacrificial layer 121b, and a second support layer 122b.

The material of the first sacrificial layer 121a and the second sacrificial layer 121b includes silicon oxide or borophospho-silicate glass (BPSG). The material of the first sacrificial layer 121a and the second sacrificial layer 121b can be doped with boron or phosphorus. The material of the first support layer 122a and the second support layer 122b includes any one or a combination of any two or more of silicon nitride, silicon nitride oxide, or silicon carbon nitride.

Figure 13:
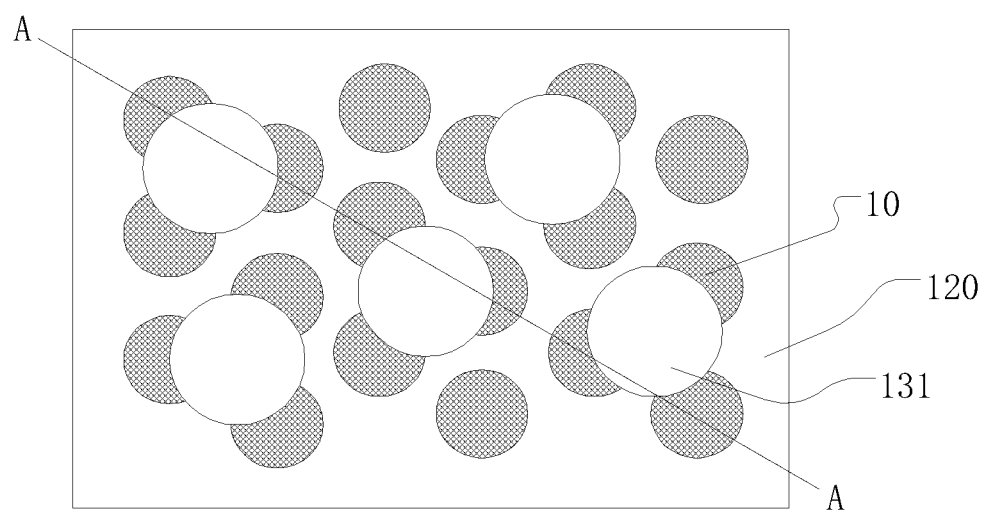
FIG. 13 is a schematic diagram of projection of a first pattern on a top surface of a stacked structure and on top surfaces of cylindrical capacitors in a manufacturing method of a semiconductor structure according to an exemplary embodiment.
Figure 14:
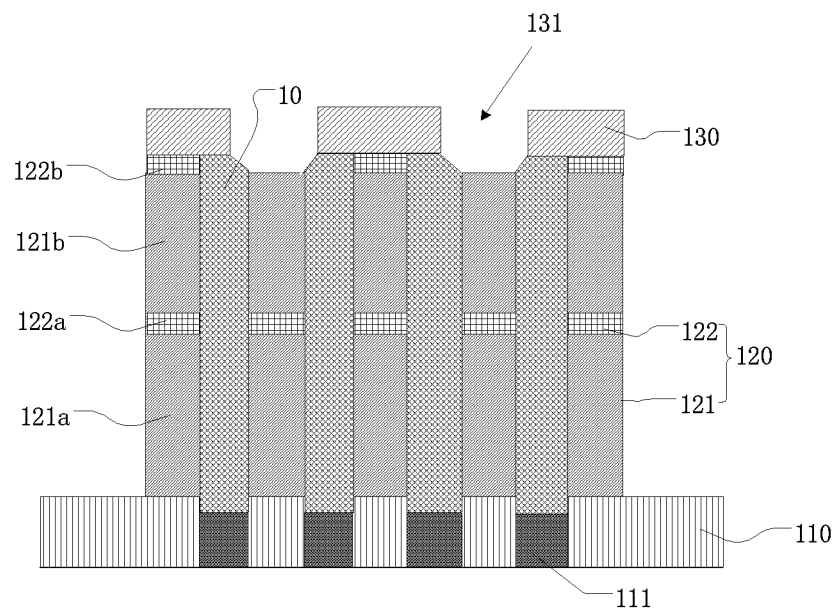
FIG. 14 is a schematic diagram of removing a second support layer according to a first pattern in a manufacturing method of a semiconductor structure according to an exemplary embodiment.
Figure 15:
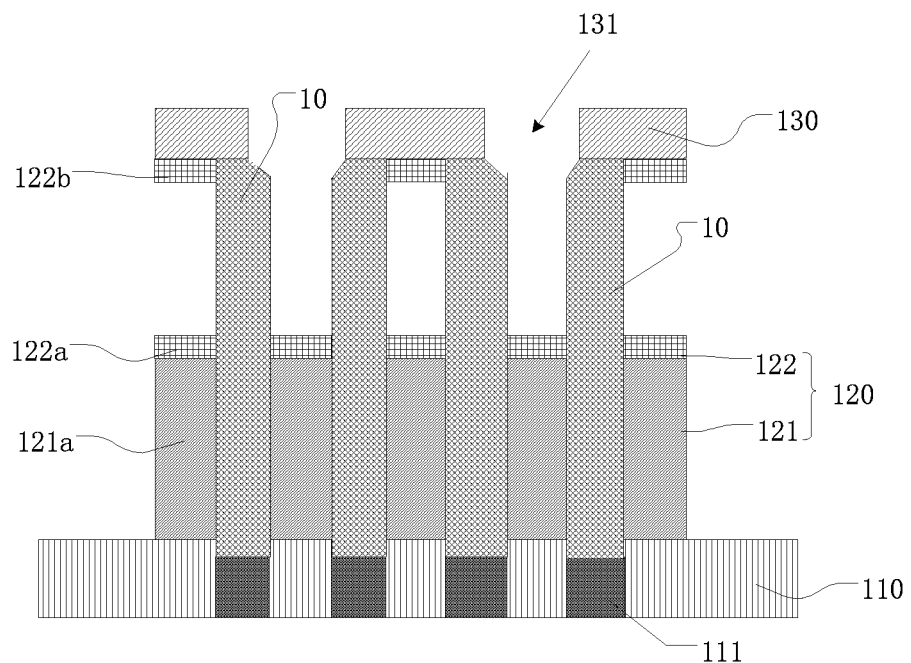
FIG. 15 is a schematic diagram of removing a second sacrificial layer in a manufacturing method of a semiconductor structure according to an exemplary embodiment.
Figure 16:
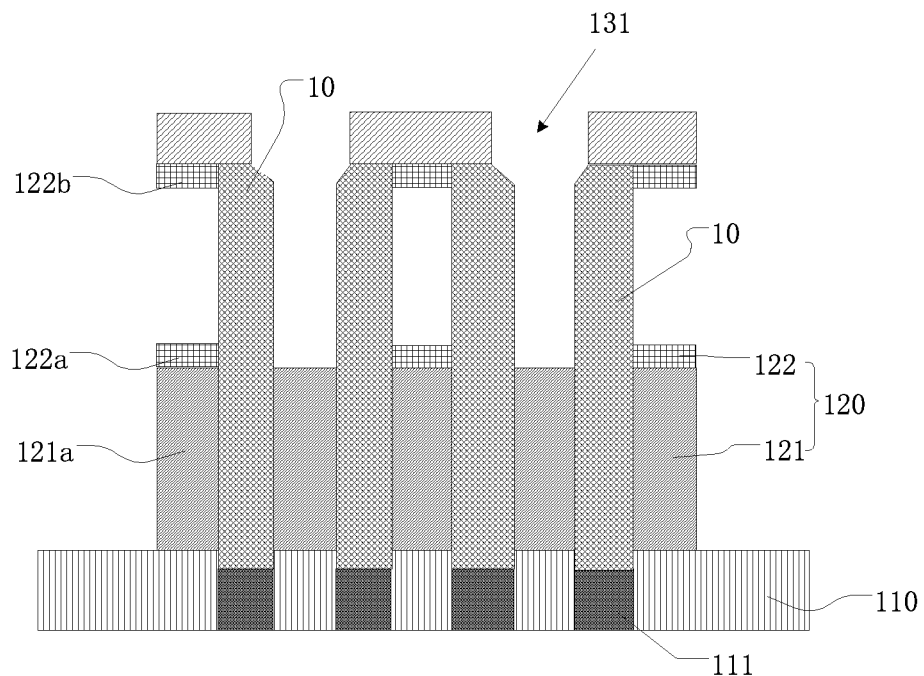
FIG. 16 is schematic diagram of removing a first support layer according to a first pattern in a manufacturing method of a semiconductor structure according to an exemplary embodiment.

In the manufacturing method of this embodiment, during formation of the trenches 140, as shown in FIG. 12, a first mask layer 130 is formed on the stacked structure 120, and a first pattern 131 is defined on the first mask layer 130. As shown in FIG. 13, the first pattern 131 at least exposes partial top surface of each of the cylindrical capacitors 10. As shown in FIG. 14 with reference to FIG. 13, the second support layer 122b corresponding to the first pattern 131 is removed through dry etching or wet etching according to the first pattern 131 of the first mask layer 130, to expose the second sacrificial layer 121b. As shown in FIG. 15 with reference to FIG. 14, the entire second sacrificial layer 121b is removed through an acid wet process, to expose the first support layer 122a; the first pattern 131 of the first mask layer 130 is transferred to the first support layer 122a. As shown in FIG. 16 with reference to FIG. 15, the first support layer 122a corresponding to the first pattern 131 is continued to be removed through dry etching or wet etching according to the first pattern 131 of the first mask layer 130, to expose the first sacrificial layer 121a; the entire first sacrificial layer 121a is removed through an acid wet process to obtain the trenches 140, as shown in FIG. 17.

As shown in FIG. 17, each of the trenches 140 formed in this embodiment is defined by sidewalls of the first support layer 122a, the second support layer 122b, and the cylindrical capacitor 10 as well as the top surface of the substrate 110. During deposition of the second top electrode 40, titanium nitride enters each of the trenches 140 through the opening, which is not covered by the cylindrical capacitor 10, of the trench 140. Titanium nitride has different deposition speeds on the sidewalls of the first support layer 122a, the second support layer 122b, and the cylindrical capacitor 10 and the top surface of the substrate 110, and the second top electrode 40 is formed on the first top electrode 30 through deposition. The second top electrode 40 deposited on the partial sidewalls, which are exposed by the trenches 140, of the cylindrical capacitors 10 has discontinuous parts. An air gap 41 is formed in each of the discontinuous parts of the second top electrode 40 in each of the trenches 140. The semiconductor structure of this embodiment ensures that the second top electrode 40 deposited through the second process can form air gaps.

The second process can be physical vapor deposition (PVD) or chemical vapor deposition (CVD). The second material may include a compound formed from one or both of a metal nitride and a metal silicide. In this embodiment, the second material may be titanium nitride, titanium silicide, titanium silicide, $TiSi_xN_y$, etc. The second deposition speed may be 5-10 nm/min.

The second deposition speed is greater than the first deposition speed in step S340, and the second material is the same as the first material.

In this embodiment, the process of physical vapor deposition (PVD) is implemented as follows. The second material being titanium nitride is taken as an example for description. The second top electrode of titanium nitride can be deposited by sputtering or reactive sputtering. The sputtering deposition of titanium nitride uses titanium nitride or titanium metal as the target. The nitrogen gas is dissociated into nitrogen ions, and the nitrogen ions hit the target to impact the metal on the target, such that titanium nitride is deposited on the first top electrode to form the second top electrode. In the physical vapor deposition process, the sputtered atoms are scattered in multiple directions and angles, and the step coverage is low. The second top electrode deposited on the partial sidewalls, which are exposed by the trenches, of the cylindrical capacitors has discontinuous parts, forming an air gap in each of the trenches.

In other possible embodiments, the chemical vapor deposition (CVD) process can be implemented as follows. The second material being titanium nitride is taken as an example for description. The semiconductor structure can be placed in a chemical vapor deposition chamber, and after evacuation, titanium nitride is deposited by reacting $TiCl_4$ or a Ti metal compound with $NH_3$ to form the second top electrode on the first top electrode. The second top electrode deposited on the partial sidewalls, which are exposed by the trenches, of the cylindrical capacitors have discontinuous parts, and the discontinuous parts of the second top electrode form air gaps in the trenches respectively.

This embodiment uses the physical vapor deposition and the chemical vapor deposition, such that the second material is deposited at a faster deposition speed to form the second top electrode. The second top electrode covering the exposed sidewalls of the cylindrical capacitors have thickness discontinuous parts, and an air gap is formed in each of the discontinuous parts, thus solving the problem of semiconductor structure leakage, and improving the electrical performance and reliability of the semiconductor structure.

Figure 4:
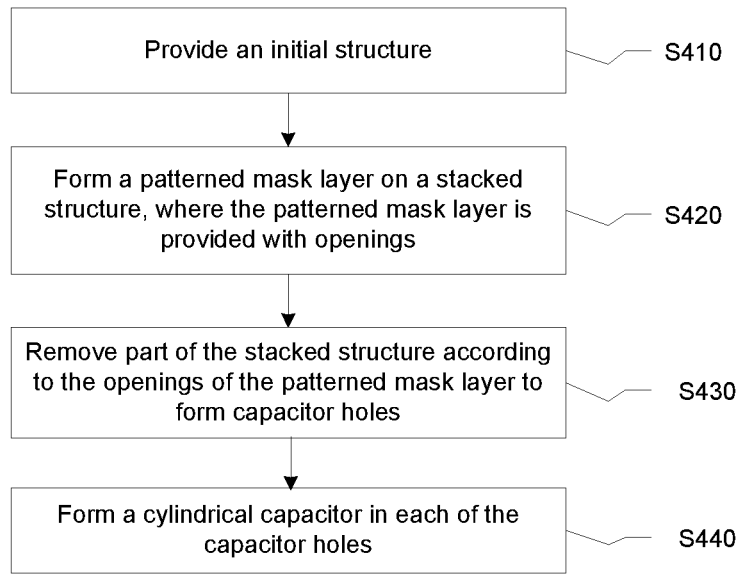
FIG. 4 is a flowchart of a manufacturing method of a semiconductor structure according to an exemplary embodiment.

An exemplary embodiment of the present disclosure provides a manufacturing method of a semiconductor structure. FIG. 4 shows a flowchart of a manufacturing method of a semiconductor structure according to an exemplary embodiment of the present disclosure. FIG. 7 to FIG. 22 are schematic diagrams of various stages of the manufacturing method of a semiconductor structure. The manufacturing method of a semiconductor structure is described below with reference to FIG. 7 to FIG. 22.

As shown in FIG. 4, an exemplary embodiment of the present disclosure provides a manufacturing method of a semiconductor structure. The manufacturing method includes the following steps:

S410: Provide an initial structure.

S420: Form a patterned mask layer on a stacked structure, where the patterned mask layer is provided with openings.

S430: Remove part of the stacked structure according to the openings of the patterned mask layer to form capacitor holes.

S440: Form a cylindrical capacitor in each of the capacitor holes.

Step S410 to step S440 in this embodiment is step S310 of forming cylindrical capacitors on the initial structure in the foregoing embodiment.

Figure 8:
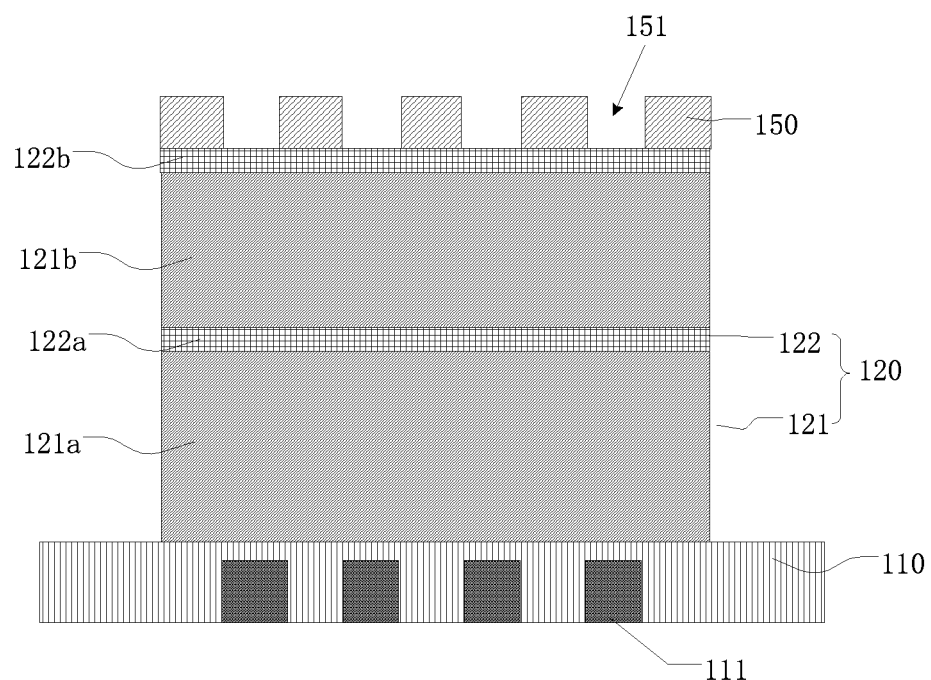
FIG. 8 is a schematic diagram of forming a patterned mask layer on an initial structure in a manufacturing method of a semiconductor structure according to an exemplary embodiment.
Figure 9:
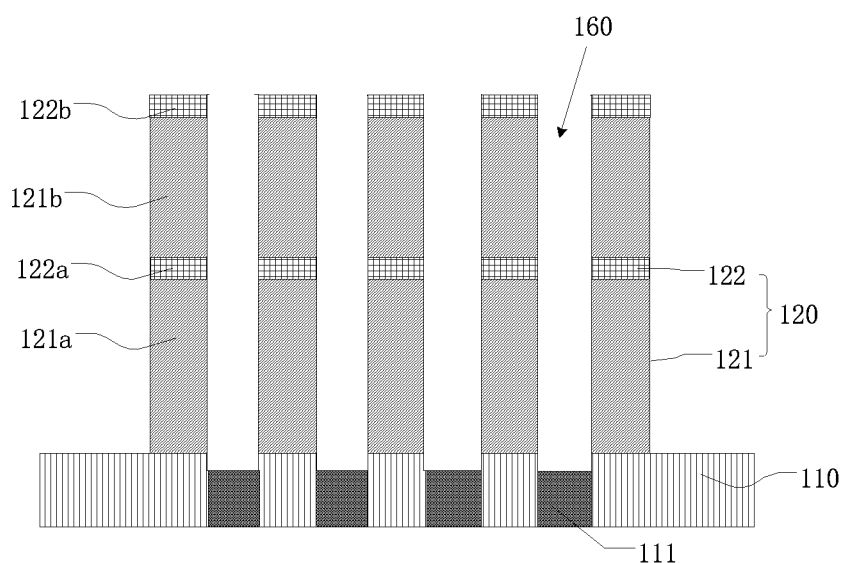
FIG. 9 is a schematic diagram of removing an initial structure according to a patterned mask layer to form capacitor holes in a manufacturing method of a semiconductor structure according to an exemplary embodiment.

Referring to shown in FIG. 7, in the process of forming the cylindrical capacitors 10, the initial structure 100 is provided first. The initial structure 100 includes a substrate 110 and a stacked structure 120 provided on the substrate 110, and capacitor contact structures 111 are provided in the substrate. Referring to FIG. 8, a patterned mask layer 150 is formed on the stacked structure 120, the patterned mask layer 150 is provided with openings 151, and the openings 151 are provided at positions corresponding to the capacitor contact structures 111. Part of the stacked structure 120 is removed according to the openings 151 of the patterned mask layer 150, until the capacitor contact structures 111 are exposed, thus forming capacitor holes 160. As shown in FIG. 9, the bottom of each of the capacitor holes 160 exposes one of the capacitor contact structures 111, the cylindrical capacitors 10 are formed in the capacitor holes 160 respectively, and the cylindrical capacitors 10 are connected to the capacitor contact structures 111 respectively.

Figure 10:
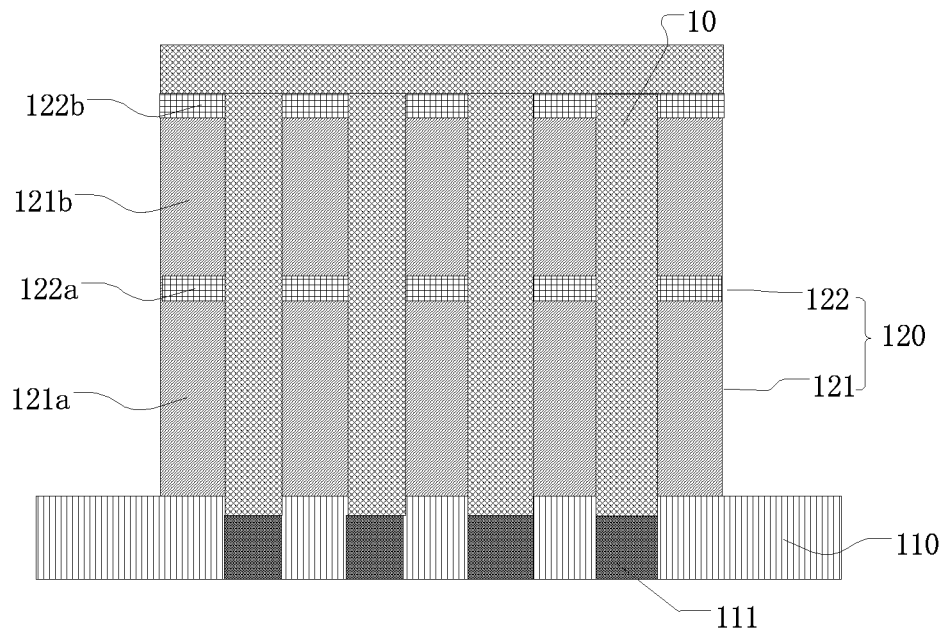
FIG. 10 is a schematic diagram of depositing cylindrical capacitors in capacitor holes in a manufacturing method of a semiconductor structure according to an exemplary embodiment.

As shown in FIG. 11 with reference to FIG. 9 and FIG. 10, the step of forming a cylindrical capacitor 10 in each of the capacitor holes 160 includes: depositing a cylindrical capacitor material in each of the capacitor holes 160 and on the top surface of the stacked structure 120; then removing the cylindrical capacitor material on the top surface of the stacked structure 120 through a dry etching process; and reserving the cylindrical capacitor material in each of the capacitor holes 160 as the cylindrical capacitor 10.

A cylindrical capacitor 10 can be deposited in each of the capacitor holes 160 through atomic layer deposition (ALD). The material of the cylindrical capacitor 10 includes a compound formed from one or both of a metal nitride and a metal silicide, such as titanium nitride, titanium silicide, titanium silicide, $TiSi_xN_y$, etc. In this embodiment, the cylindrical capacitor 10, the first top electrode 30 and the second top electrode 40 are made of the same material, which is titanium nitride.

Figure 5:
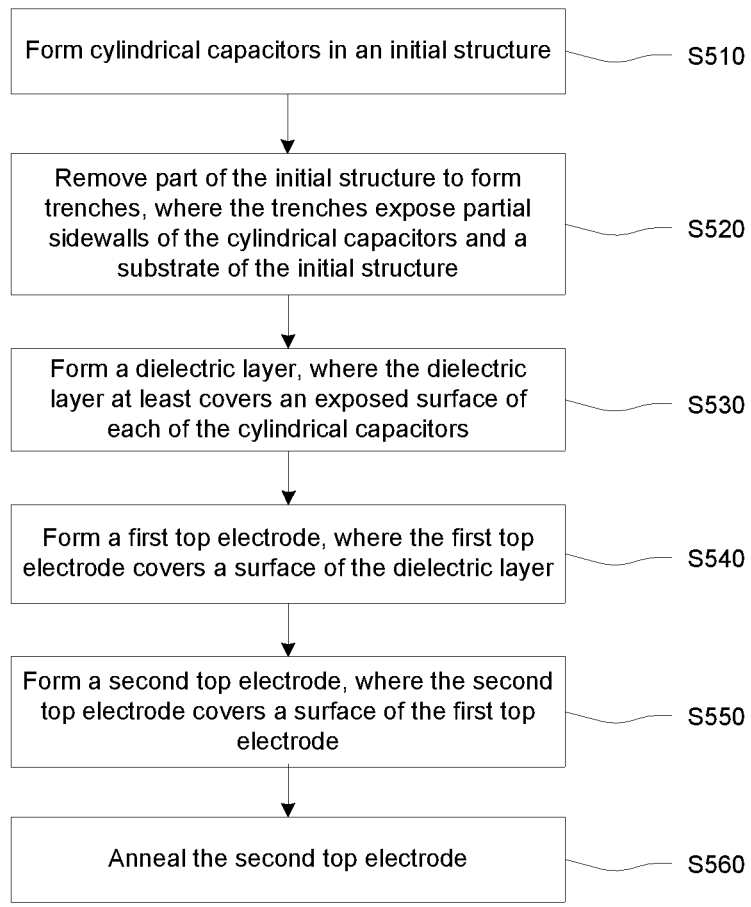
FIG. 5 is a flowchart of a manufacturing method of a semiconductor structure according to an exemplary embodiment.

An exemplary embodiment of the present disclosure provides a manufacturing method of a semiconductor structure. FIG. 5 shows a flowchart of a manufacturing method of a semiconductor structure according to an exemplary embodiment of the present disclosure. FIG. 7 to FIG. 22 are schematic diagrams of various stages of the manufacturing method of a semiconductor structure. The manufacturing method of a semiconductor structure is described below with reference to FIG. 7 to FIG. 22.

As shown in FIG. 5, an exemplary embodiment of the present disclosure provides a manufacturing method of a semiconductor structure. The manufacturing method includes the following steps:
S510: Form cylindrical capacitors in an initial structure.
S520: Remove part of the initial structure to form trenches, where the trenches expose partial sidewalls of the cylindrical capacitors and a substrate of the initial structure.
S530: Form a dielectric layer, where the dielectric layer at least covers an exposed surface of each of the cylindrical capacitors.
S540: Form a first top electrode, where the first top electrode covers a surface of the dielectric layer.
S550: Form a second top electrode, where the second top electrode covers a surface of the first top electrode.
S560: Anneal the second top electrode.

Steps S510 to S550 in this embodiment are implemented in the same manner as steps S310 to S350 of the foregoing embodiment, and will not be described in detail again herein.

The annealing process is carried out in an ammonia atmosphere. The annealing process can be performed at different temperature ranges depending on the type of the second material. For example, when the second material is titanium nitride, the annealing process is performed in a first temperature range of 400° C. to 500° C. and the annealing time is less than 1 minute.

In this embodiment, the second top electrode 40 is deposited through physical vapor deposition (PVD) or chemical vapor deposition (CVD) with a higher second deposition speed. The annealing process can remove the stress from the second top electrode and remove the impurities doped in the second top electrode by vapor deposition. In addition, the annealing process promotes the diffusion of metal atoms in the second top electrode, thus filling deposition vacancies generated during deposition of the second top electrode. The annealed second top electrode improves the electrical conductivity and stability of the semiconductor structure.

Figure 6:
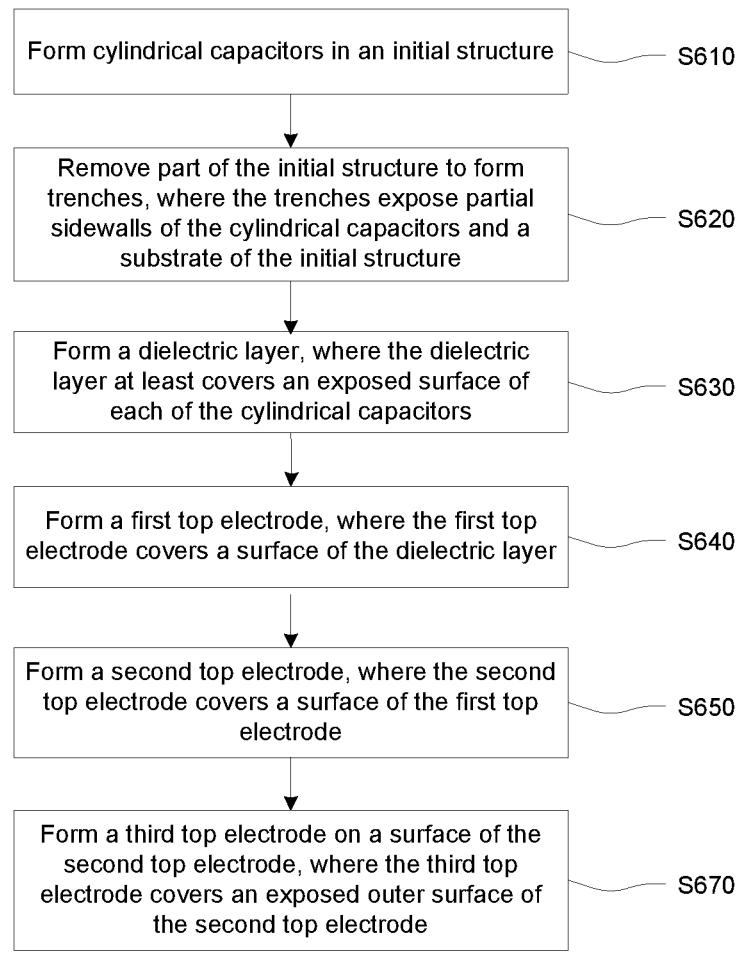
FIG. 6 is a flowchart of a manufacturing method of a semiconductor structure according to an exemplary embodiment.

An exemplary embodiment of the present disclosure provides a manufacturing method of a semiconductor structure. FIG. 6 shows a flowchart of a manufacturing method of a semiconductor structure according to an exemplary embodiment of the present disclosure. FIG. 7 to FIG. 22 are schematic diagrams of various stages of the manufacturing method of a semiconductor structure. The manufacturing method of a semiconductor structure is described below with reference to FIG. 7 to FIG. 22.

As shown in FIG. 6, an exemplary embodiment of the present disclosure provides a manufacturing method of a semiconductor structure. The manufacturing method includes the following steps:
S610: Form cylindrical capacitors in an initial structure.
S620: Remove part of the initial structure to form trenches, where the trenches expose partial sidewalls of the cylindrical capacitors and a substrate of the initial structure.
S630: Form a dielectric layer, where the dielectric layer at least covers an exposed surface of each of the cylindrical capacitors.
S640: Form a first top electrode, where the first top electrode covers a surface of the dielectric layer.
S650: Form a second top electrode, where the second top electrode covers a surface of the first top electrode.
S670: Form a third top electrode on a surface of the second top electrode, where the third top electrode covers an exposed outer surface of the second top electrode.

Steps S610 to S650 in this embodiment are implemented in the same manner as steps S510 to S550 of the foregoing embodiment, and will not be described in detail again herein.

Figure 21:
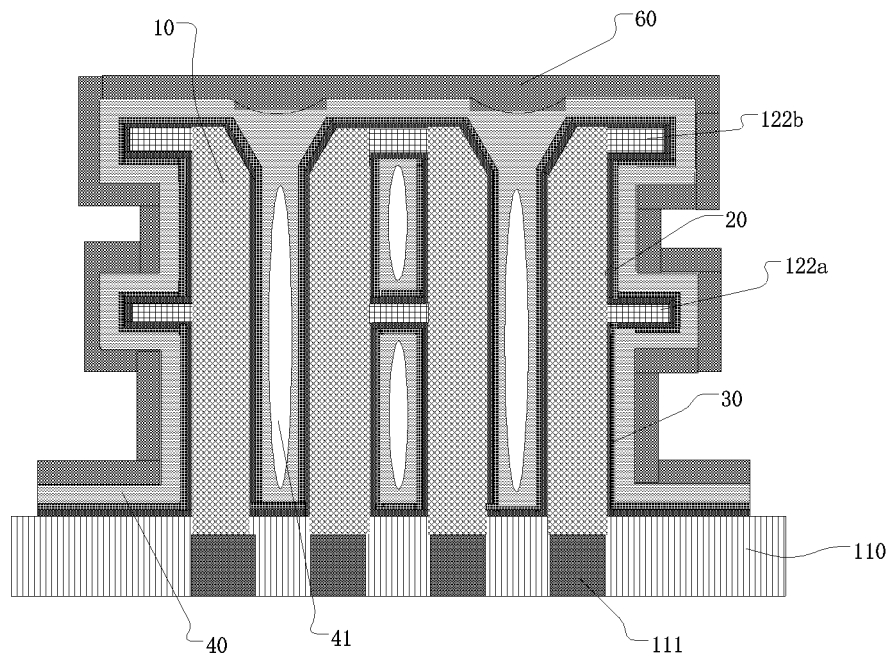
FIG. 21 is a schematic diagram of forming a third top electrode in a manufacturing method of a semiconductor structure according to an exemplary embodiment.

As shown in FIG. 21, the third top electrode 60 can be deposited through physical vapor deposition (PVD) or chemical vapor deposition (CVD). The material of the third top electrode may include a compound formed from one or two of a metal, a metal nitride and a metal silicide, such as tungsten, titanium nitride, titanium silicide, titanium silicide, $TiSi_xN_y$, etc. The material of the third top electrode 60 may be the same as or different from that of the first top electrode 30 and second top electrode 40. In this embodiment, the material of the third top electrode 60 is tungsten.

In the manufacturing method of this embodiment, the third top electrode is deposited on the second top electrode. The third top electrode protects the semiconductor structure while enhancing the conductivity of the semiconductor structure. In addition, tungsten is used as the material of the third top electrode to substitute the boron-doped layer, thus fundamentally solving the problem of capacitor leakage caused by penetration of boron particles into the dielectric material of the capacitor structure.

Figure 22:
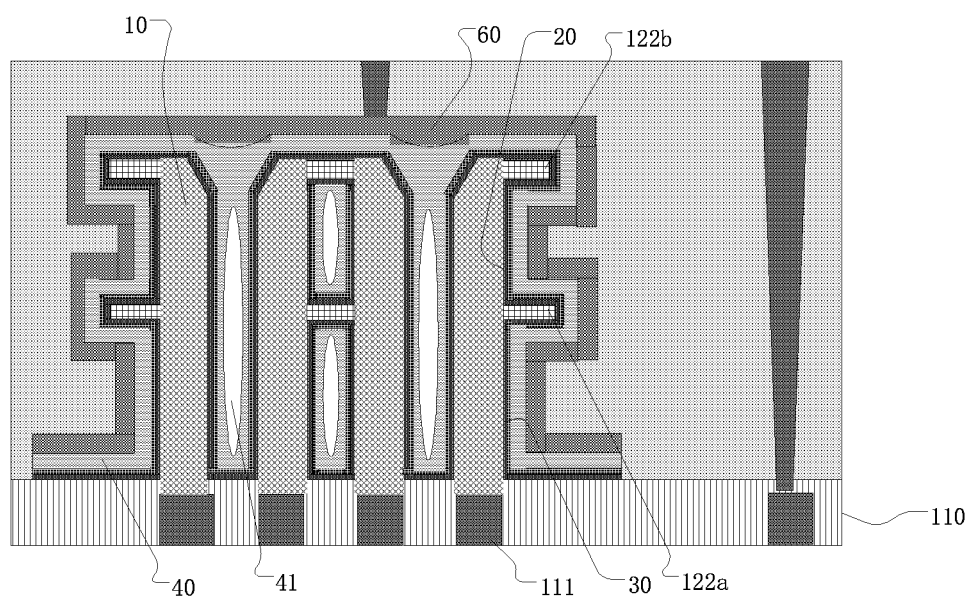
FIG. 22 is a schematic diagram of a back end of line (BEOL) process in a manufacturing method of a semiconductor structure according to an exemplary embodiment.

As shown in FIG. 22, the manufacturing method of this embodiment also includes a back end of line (BEOL) process, in which the semiconductor structure is subject to processing such as BEOL bonding, bonder, FCB, and ball grid array (BGA) packaging.

The semiconductor structure made by the manufacturing method of this embodiment can be used as a memory device, and the memory device can be used in a dynamic random access memory (DRAM). The memory device can also be used in a static random access memory (SRAM), a flash memory, a ferroelectric random access memory (FeRAM), a magnetic random access memory (MRAM), a phase change random access memory (PRAM), etc.

An exemplary embodiment of the present disclosure provides a semiconductor structure. As shown in FIG. 20, the semiconductor structure includes a substrate 110, capacitor contact structures 111 in the substrate 110, and cylindrical capacitors 10, where the bottom of each of the cylindrical capacitors 10 is electrically connected to one of the capacitor contact structures 111, and a trench 140 is provided between adjacent cylindrical capacitors 10.

The semiconductor structure in this embodiment further includes a dielectric layer 20, a first top electrode 30, and a second top electrode 40, where the dielectric layer 20 covers a surface of the cylindrical capacitor 10 and part of the substrate 110, the first top electrode 30 covers a surface of the dielectric layer 20, and the second top electrode 40 covers the first top electrode 30.

The second top electrode 40 includes discontinuous parts, the discontinuous parts are located in the trenches 140 respectively, and an air gap 41 is formed in each of the discontinuous parts. In an axial direction of each of the cylindrical capacitors 10, the thickness of the discontinuous part of the second top electrode 40 covering the sidewall of the cylindrical capacitor 10 changes continuously.

The air gap 41 formed between adjacent cylindrical capacitors 10 can reduce the boron-doped layer filled between the cylindrical capacitor 10, and also reduce the density of boron particles in the boron-doped layer. The total amount of boron particles diffused into the dielectric layer 20 during the thermal process is significantly reduced, which can avoid the semiconductor structure leakage.

An exemplary embodiment of the present disclosure provides a semiconductor structure. The semiconductor structure in this embodiment is substantially the same as the foregoing embodiment. The difference is that, in this embodiment, in the axial direction of each of the cylindrical capacitors 10, the thickness of the discontinuous part of the second top electrode 40 covering the sidewall of the cylindrical capacitor 10 gradually increases from the middle to both ends.

An exemplary embodiment of the present disclosure provides a semiconductor structure. The semiconductor structure in this embodiment is substantially the same as the foregoing embodiment. The difference is that, as shown in FIG. 21, the semiconductor structure further includes a third top electrode 60, where the third top electrode 60 covers an exposed outer surface of the second top electrode 40.

For example, the material of the first top electrode 30 is the same as that of the second top electrode 40. The material of the third top electrode 60 is the same as or different from that of the second top electrode 40.

For example, the material of the first top electrode 30 and the second top electrode 40 is titanium nitride, and the material of the third top electrode 60 is tungsten.

Each embodiment or implementation in the specification of the present disclosure is described in a progressive manner. Each embodiment focuses on the difference from other embodiments, and the same and similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the semiconductor structure and the manufacturing method thereof, an air gap is formed between adjacent cylindrical capacitors, to reduce the doping layer filled between the cylindrical capacitors, such that the semiconductor structure leakage can be avoided.

The invention claimed is:

1. A manufacturing method of a semiconductor structure, comprising:
   forming a plurality of cylindrical capacitors in an initial structure;
   removing part of the initial structure to form trenches, wherein the trenches expose partial sidewalls of the cylindrical capacitors and a substrate of the initial structure;
   forming a dielectric layer, wherein the dielectric layer at least covers an exposed surface of each of the cylindrical capacitors;
   forming a first top electrode covers a surface of the dielectric layer, wherein forming the first top electrode comprises: depositing a first material on the dielectric layer at a first deposition speed through a first process to form the first top electrode; and
   forming a second top electrode covers a surface of the first top electrode, depositing a second material on the first top electrode at a second deposition speed through a second process to form the second top electrode, the deposition speed of formed the first top electrode less than the deposition speed of formed the second top electrode; and,
   wherein in an axial direction of each of the cylindrical capacitors, the second top electrode formed in each of the trenches has a discontinuous part, and an air gap is formed in the discontinuous part of the second top electrode.

2. The manufacturing method of the semiconductor structure according to claim 1, wherein
   the discontinuous part of the second top electrode covers the partial sidewalls of the cylindrical capacitor exposed by the trench, and on the partial sidewalls of the cylindrical capacitor covered by the discontinuous part, a thickness of the second top electrode changes continuously.

3. The manufacturing method of the semiconductor structure according to claim 1, wherein
   the first material is the same as the second material.

4. The manufacturing method of the semiconductor structure according to claim 1, wherein
   the forming a plurality of cylindrical capacitors in the initial structure comprises:
   providing the initial structure, wherein the initial structure comprises a substrate and a stacked structure provided on the substrate;
   forming a patterned mask layer on the stacked structure, wherein the patterned mask layer is provided with openings;
   removing part of the stacked structure according to the openings of the patterned mask layer to form capacitor holes, wherein a bottom of each of the capacitor holes exposes the substrate; and
   forming the cylindrical capacitor in each of the capacitor holes.

5. The manufacturing method of the semiconductor structure according to claim 4, wherein
   the stacked structure comprises sacrificial layers and support layers; and
   the removing part of the initial structure to form trenches comprises:
   removing the sacrificial layers and part of the support layers of the initial structure, to form the trenches.

6. The manufacturing method of the semiconductor structure according to claim 5, wherein
   the sacrificial layers and the support layers are formed above the substrate, and the sacrificial layers and the support layers are stacked alternately.

7. The manufacturing method of the semiconductor structure according to claim 1, further comprising:
   annealing the second top electrode.

8. The manufacturing method of the semiconductor structure according to claim 1, further comprising:
   forming a third top electrode on a surface of the second top electrode, wherein the third top electrode covers an exposed outer surface of the second top electrode, and a material of the third top electrode is the same as or different from a material of the second top electrode.

9. A semiconductor structure, comprising:
   a substrate;
   capacitor contact structures, located in the substrate;
   cylindrical capacitors, wherein a bottom of each of the cylindrical capacitors is electrically connected to one of the capacitor contact structures;
   trenches, wherein each of the trenches is located between adjacent cylindrical capacitors;
   a dielectric layer, covering a surface of each of the cylindrical capacitors and part of the substrate;
   a first top electrode, covering a surface of the dielectric layer; and
   a second top electrode, covering the first top electrode, wherein the second top electrode comprises discontinuous parts, each of the discontinuous parts is located in the trench, and an air gap is provided in the discontinuous part, wherein a deposition speed of formed the first top electrode less than a deposition speed of formed the second top electrode.

10. The semiconductor structure according to claim 9, wherein
    in an axial direction of each of the cylindrical capacitors, a thickness of the discontinuous part of the second top electrode covering sidewalls of the cylindrical capacitor changes continuously.

11. The semiconductor structure according to claim 10, wherein
    in the axial direction of each of the cylindrical capacitors, the thickness of the discontinuous part of the second top electrode covering the sidewalls of the cylindrical capacitor gradually increases from a middle to both ends.

12. The semiconductor structure according to claim 9, wherein
    the semiconductor structure further comprises a third top electrode, and the third top electrode covers an exposed outer surface of the second top electrode.

13. The semiconductor structure according to claim 9, wherein
    a material of the first top electrode is the same as a material of the second top electrode.

* * * * *